(12) United States Patent
Miyashita

(10) Patent No.: US 7,652,335 B2
(45) Date of Patent: Jan. 26, 2010

(54) REVERSELY TAPERED CONTACT STRUCTURE COMPATIBLE WITH DUAL STRESS LINER PROCESS

(75) Inventor: Katsura Miyashita, Kanagawa (JP)

(73) Assignee: Toshiba America Electronics Components, Inc., Irvine, CA (US)

( * ) Notice: Subject to any disclaimer, the term of this patent is extended or adjusted under 35 U.S.C. 154(b) by 92 days.

(21) Appl. No.: 11/873,733

(22) Filed: Oct. 17, 2007

(65) Prior Publication Data

US 2009/0101943 A1   Apr. 23, 2009

(51) Int. Cl.
*H01L 29/94* (2006.01)

(52) U.S. Cl. .............................. 257/368; 257/E21.409; 438/657

(58) Field of Classification Search ................. 257/213, 257/314, 288, 368, E21.409, E29.229, E21.476, 257/E23.01, E29.345, 775; 438/222, 197, 438/657
See application file for complete search history.

(56) References Cited

U.S. PATENT DOCUMENTS

| | | | |
|---|---|---|---|
| 6,331,469 B1 | 12/2001 | Park et al. | |
| 6,462,373 B2 * | 10/2002 | Shimizu et al. | 257/315 |
| 6,465,866 B2 | 10/2002 | Park et al. | |
| 6,882,025 B2 | 4/2005 | Yeo et al. | |
| 6,894,363 B2 | 5/2005 | Tamura | |
| 2005/0101081 A1 * | 5/2005 | Goda et al. | 438/222 |
| 2006/0019438 A1 | 1/2006 | Harakawa | |

* cited by examiner

*Primary Examiner*—Thomas L Dickey
*Assistant Examiner*—Fazli Erdem
(74) *Attorney, Agent, or Firm*—Banner & Witcoff, Ltd.

(57) ABSTRACT

A semiconductor device having a silicon layer, a transistor having an electrical connection region in the silicon layer; and a conductive plug formed on and in electrical contact with the electrical connection region, the plug having side walls that taper inward away from the silicon layer.

15 Claims, 9 Drawing Sheets

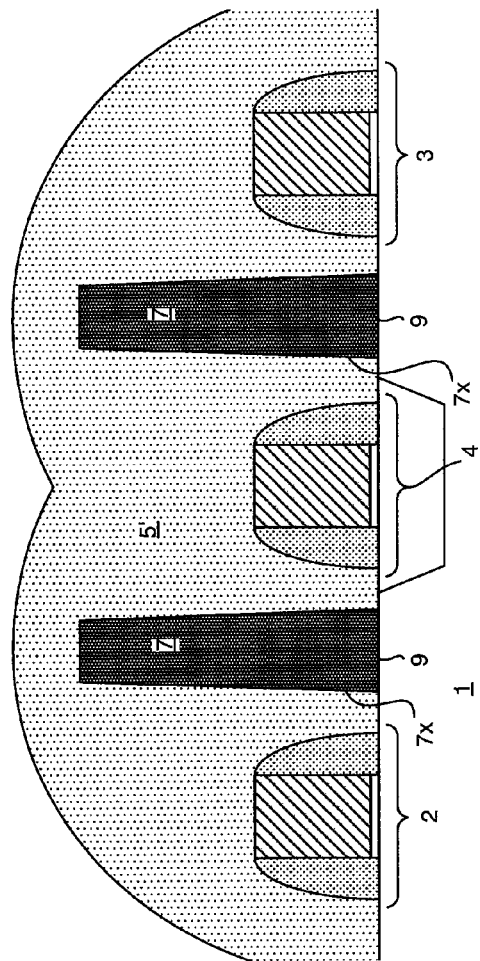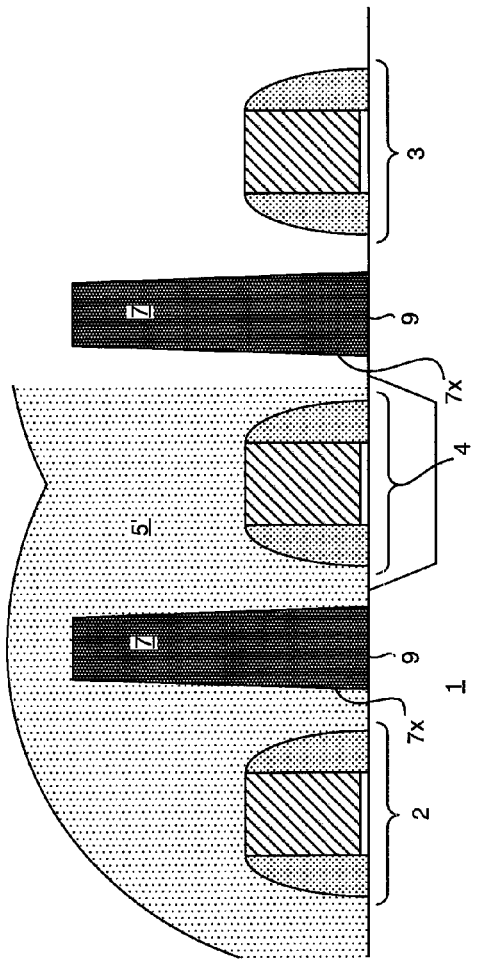

REVERSELY TAPERED CONTACT STRUCTURE COMPATIBLE WITH DUAL STRESS LINER PROCESS

BACKGROUND

Dual-stress liner technology is a known strained silicon process which enhances the performance of n-type field-effect transistors (nFETs) and p-type field-effect transistors (pFETs), by stretching the bonds between silicon atoms in one type of transistor and compressing them in the other. To create a dual-stress liner, a highly tensile $Si_3N_4$ liner is deposited over a semiconductor device that includes one or more pFETs and nFETs. The film is then patterned and etched from pFET regions. Next, a highly compressive $Si_3N_4$ liner is deposited, and this film is then patterned and etched from nFET regions.

Dual-stress liner technology is known to improve performance of both nFETs and pFETs. However, two stress liner materials are required for nFETs and pFETs, respectively. In order to avoid moisture or mobile ions from entering the FETs during the back end of line (BEOL) process, it is important that the two liner materials do not have any voids or seams between them. This means the two liner materials need to overlap.

After the liner films are applied, the plugs of contact structures are added by etching holes in the liner materials at the desired locations and then filling the holes with the desired metal to form the plugs.

However, when determining placement of the contact structure (which includes both a plug and contact), some contact structures need to be placed close to, or even directly on, the overlap region in the chip. Since the liner thickness in an overlap region is twice as thick as in a non-overlap region, it can be difficult to simultaneously etch the contact holes in both the overlap regions and the non-overlap regions without resulting in under-etching or over-etching in some contact holes. Under-etching results open an unintended open circuit, and over-etching can destroy the device or at least significantly reduce performance.

Moreover, by nature of the etching process, the hole formed for the plugs has sides that taper inwardly so that the resulting plugs are smaller at the bottom than at the top. That is, a tapered plug forms with a bottom inner taper angle of greater than 90 degrees. The smaller the contact area between the bottom of the plug and the silicon layer, the larger the resistance of that contact area. It is generally preferred that the contact resistance between a plug and the circuit element being serviced by that plug be as small as possible. A higher contact resistance reduces performance and increases power consumption.

For example, as shown in FIG. 1, nFET 2 and pFET 3 are formed on a silicon layer 1. A dummy gate or poly-interconnect 4 is formed between the nFET 2 and the pFET 3. A first silicon nitride layer 5 (tensile stress liner) is applied to the silicon layer and a portion of the first silicon nitride layer is removed. A second silicon nitride layer 6 (compressive stress liner) is applied to the silicon layer and a portion of the second silicon nitride layer is removed. Plugs 7a and 7b are then added by etching holes in the silicon nitride layers and filling the holes. The etching for the plugs is typically conducted simultaneously across the entire semiconductor wafer.

Because the thickness of the silicon nitride is uneven, portions of the silicon nitride may be over-etched or under-etched. For example, in FIG. 1, the overlap of the tensile stress liner 5 and the compressive stress liner 6 causes under-etching in the overlap region. Under-etching, for example, results in plug 7b not contacting silicon layer 1, providing a gap or open area that affects the performance of pFET 3.

BRIEF SUMMARY

It is desired to produce plugs that have the appropriate contact with the their respective circuit elements in a semiconductor device. It is also desired to provide a larger contact area between the bottom of the plug and the silicon layer to reduce resistance there-between.

Accordingly, the present disclosure describes forming a semiconductor device, having a silicon layer; a transistor having an electrical connection region in the silicon layer; and a conductive plug formed on and in electrical contact with the electrical connection region, the plug having side walls that taper inward away from the silicon layer.

The present disclosure also describes forming a semiconductor device, having a silicon layer and a FET having a gate formed on the silicon layer. A metal layer is disposed on the silicon layer and electrically connected to a source or a drain of the FET, the metal layer having sidewalls that taper inward away from the silicon layer.

The present disclosure also describes a method for manufacturing a semiconductor device. A polysilicon layer may be formed on a dielectric upon a silicon layer. A metal layer may be formed on the silicon layer and on the polysilicon layer. A portion of the metal layer may be removed such that at least some of the metal layer remains disposed on the silicon layer.

These and other aspects will be apparent upon consideration of the following detailed description of illustrative embodiments.

BRIEF DESCRIPTION OF THE DRAWINGS

A more complete understanding may be acquired by referring to the following description in consideration of the accompanying drawings, in which like reference numbers indicate like features, and wherein:

FIGS. 5-14 are side views of a structure during various steps in a process for manufacturing an illustrative embodiment of reversely tapered plug.

DETAILED DESCRIPTION OF ILLUSTRATIVE EMBODIMENTS

Figure 1:
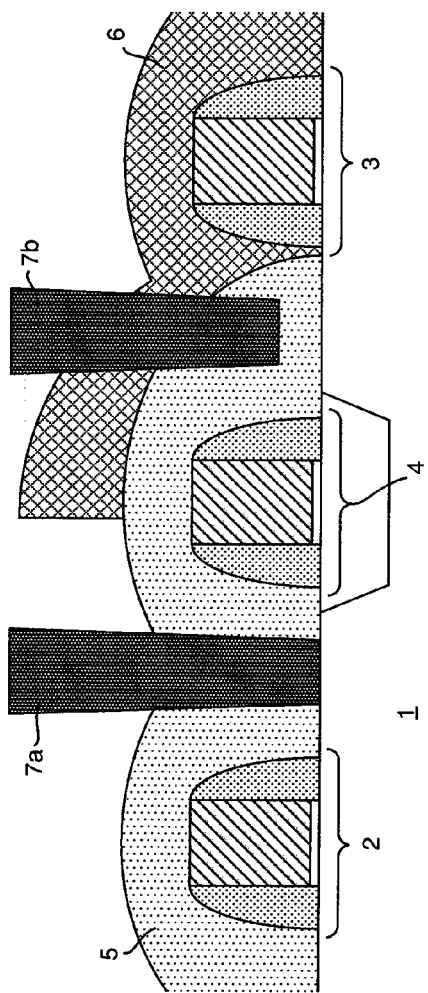
FIG. 1 is a portion of a device having conventional contact structures having contacts and plugs.

It has been discovered that forming a conductive plug with a reverse taper can avoid the problem of under-etching, such as shown in FIG. 1, as well as over-etching. It has been further discovered that the reverse taper may be used with any process of providing a plug that may otherwise result in an undesired open area including both single liner processes and dual stress liner processes.

Figure 2:
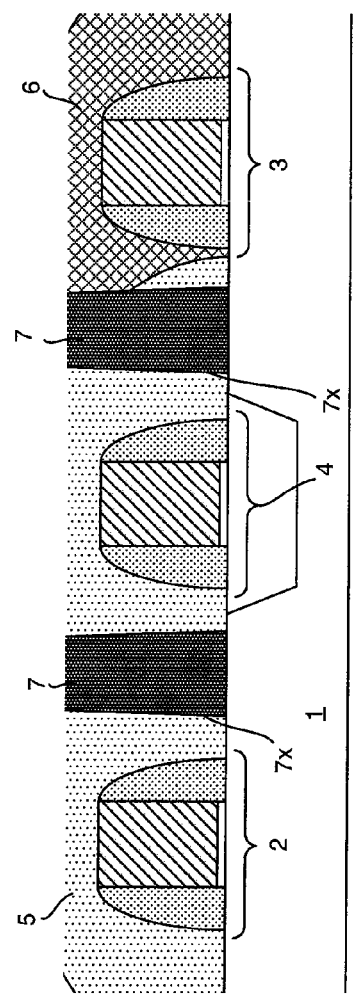
FIG. 2 is a side view of an illustrative embodiment of a portion of a device having a reversely tapered plug.
Figure 3:
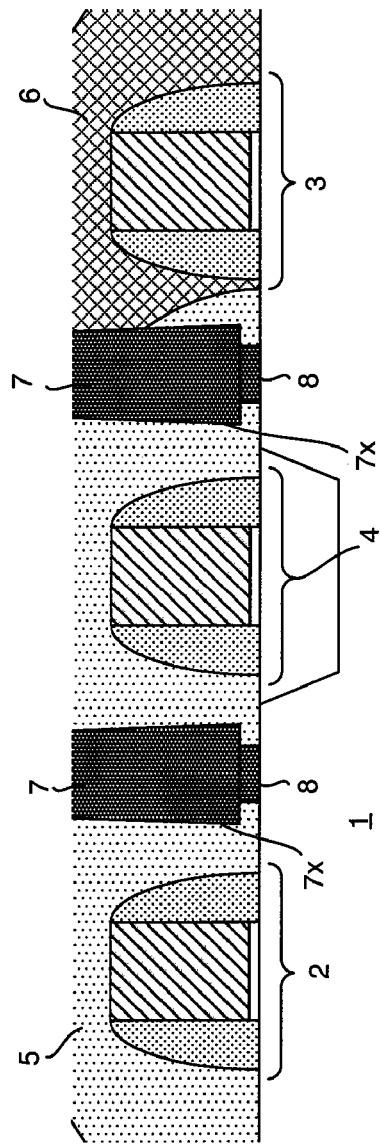
FIG. 3 is a side view of an illustrative embodiment of a portion of a further device having a reversely tapered plug and a barrier layer.
Figure 4:
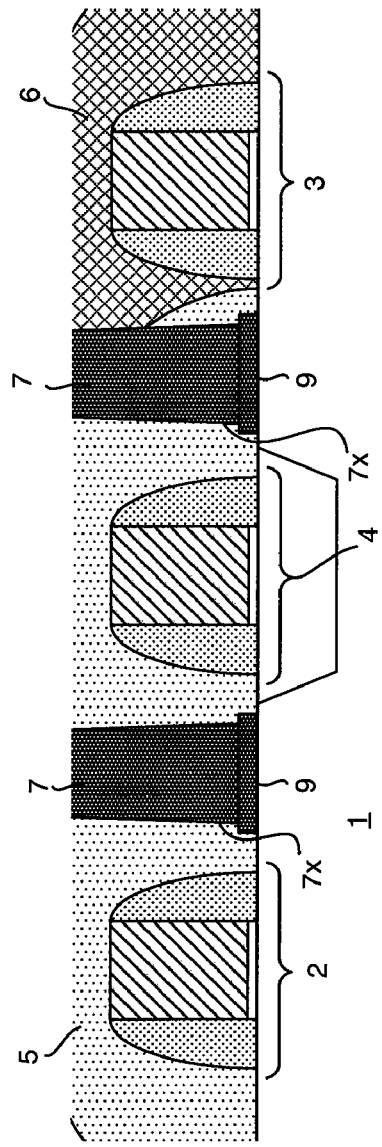
FIG. 4 is a side view of an illustrative embodiment of a portion of another device having a reversely tapered plug and a barrier layer.

FIGS. 2-4 depict semiconductor devices having both pFET and nFET regions and plugs electrically and physically connected to the source and drain of each pFET and nFET.

Figure 15:
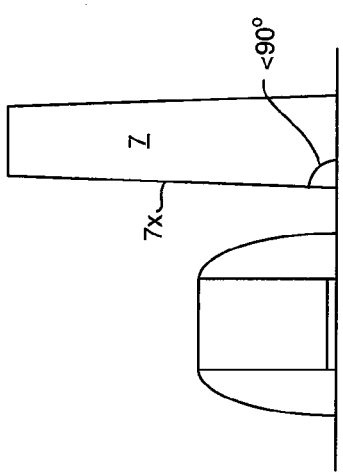
FIG. 15 depicts the taper angle of an illustrative tapered plug.

Specifically, FIG. 2 shows a structure having a tapered plug 7 in electrical and direct physical contact with silicon layer 1 and having a bottom inner taper angle of less than 90 degrees, for example less than or equal to 87 degrees such as in the range of 80 to 87 degrees. See FIG. 15.

The acute inner taper angle of the sidewalls 7x of plug 7 may provide a larger bottom surface area in electrical contact with the silicon layer 1 as compared with if the inner taper angle were obtuse. The larger the contact surface area, the smaller the resistance R between plug 7 and silicon layer 1. Moreover, the parasitic capacitance C between the gates 2 and 3 and the respective tapered plug 7 is generally nearly equal to the capacitance between the gates and a conventional plug structure of the same size. Thus, the RC propagation delay which is related to the respective tapered plug 7 may be reduced without affecting circuit density or layout.

The plugs 7 may be formed, for example by lithography and etching, as a patterned layer of metal or other conductive material onto a silicon layer. Typically, the desired gates have already been formed on the silicon layer FIGS. 3 and 4 show plugs 7 formed on at least one conductive barrier layer, 8 and 9 respectively. A barrier layer is within the skill of the art and prevents or otherwise reduces migration of atoms between different materials. Here, the plugs 7 have a tapered structure similar to that of FIG. 2 and a bottom inner taper angle of less than 90 degrees, for example less than or equal to 87 degrees such as in the range of 80 to 87 degrees. The barrier layer 8 may have an area less than the bottom surface area of its respective plug 7, as shown in FIG. 3. Or, the barrier layer 9 may have an area greater than the bottom surface area of its respective plug 7, as shown in FIG. 4. Alternatively, the barrier layer may have an area equal to the bottom surface area of its respective plug 7. The barrier layer 8, 9 is formed on silicon layer 1 prior to forming the plugs 7. The plugs 7 and barrier layer 8, 9 may comprise the same or different materials. For instance, the plugs 7 and the barrier layer 8, 9 may be of the same metal or of different metals. If more than one barrier layer is present for a given plug 7, each barrier layer may be of the same or different materials.

The barrier layer 8 or 9 may be formed of any suitable material such as, but not limited to, titanium or titanium nitride. The barrier layer 8 or 9 is formed on the bottom of the plugs 7 between the plugs 7 and the silicon layer 1. The barrier layer does not extend up the sidewalls 7x of the plugs.

The barrier layer 8 or 9 may be made by applying the barrier material to the silicon layer, and undesired portions of the barrier layer 8 or 9 can be removed by lithography and etching. Where the width of the barrier layer 9 is to be the same as or larger than the width of each plug 7, the metal for the plugs 7 can be applied prior to or after etching of the barrier layer 9. That is, the plugs 7 and barrier layer 9 can be etched at the same time. Where the width of the barrier layer 8 is to be the smaller than the width of the plugs 7, then the barrier layer 8 can be etched prior to forming of the plugs 7, the desired silicon nitride can then be formed up to the thickness of the barrier layer, and then the plugs 7 can be formed as discussed above. Techniques for applying barrier layers to various surfaces are within the skill of the art.

FIGS. 5-14 show one embodiment of a method of manufacturing a semiconductor device in accordance with FIG. 2.

Figure 5:
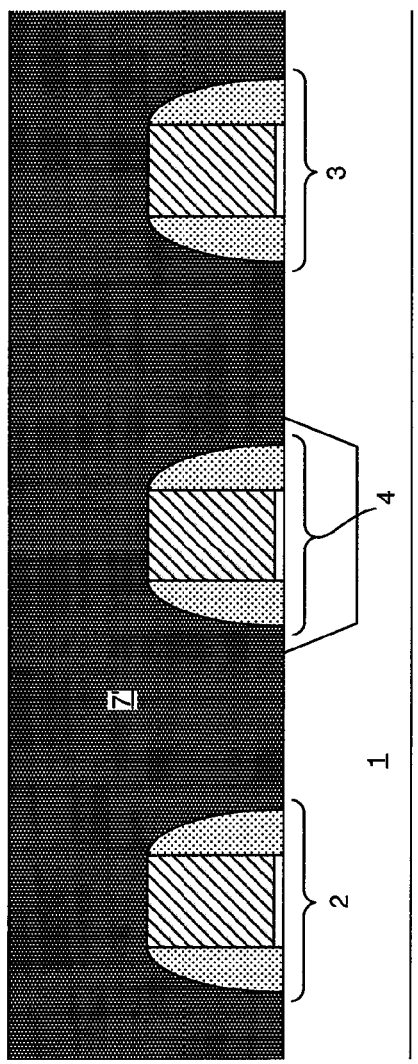

In particular, FIG. 5 depicts the forming of a metal (or other conductive material) layer 7' on a silicon layer 1 already having nFET and pFET gate and spacer structures thereon. Any suitable method may be used to apply the metal. The metal is applied to at least a thickness of the desired plugs.

Figure 6:
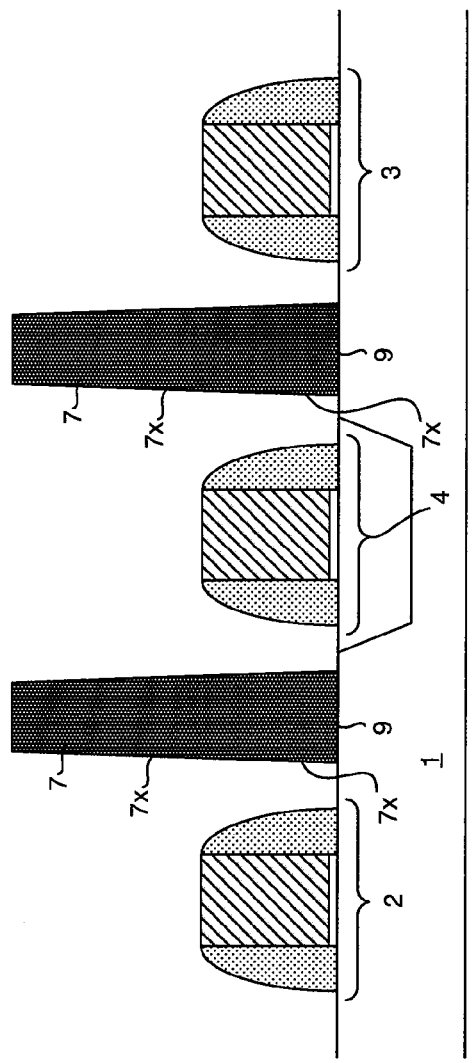

FIG. 6 depicts the formation of plugs 7 as a result of lithography and etching of metal layer 7'. The metal layer 7' is etched such that plugs 7 are each formed having a taper formed inwardly from the silicon layer. Such tapering of the sides of a tall structure is a natural and inherent result of standard lithography and etching techniques.

Figure 9:
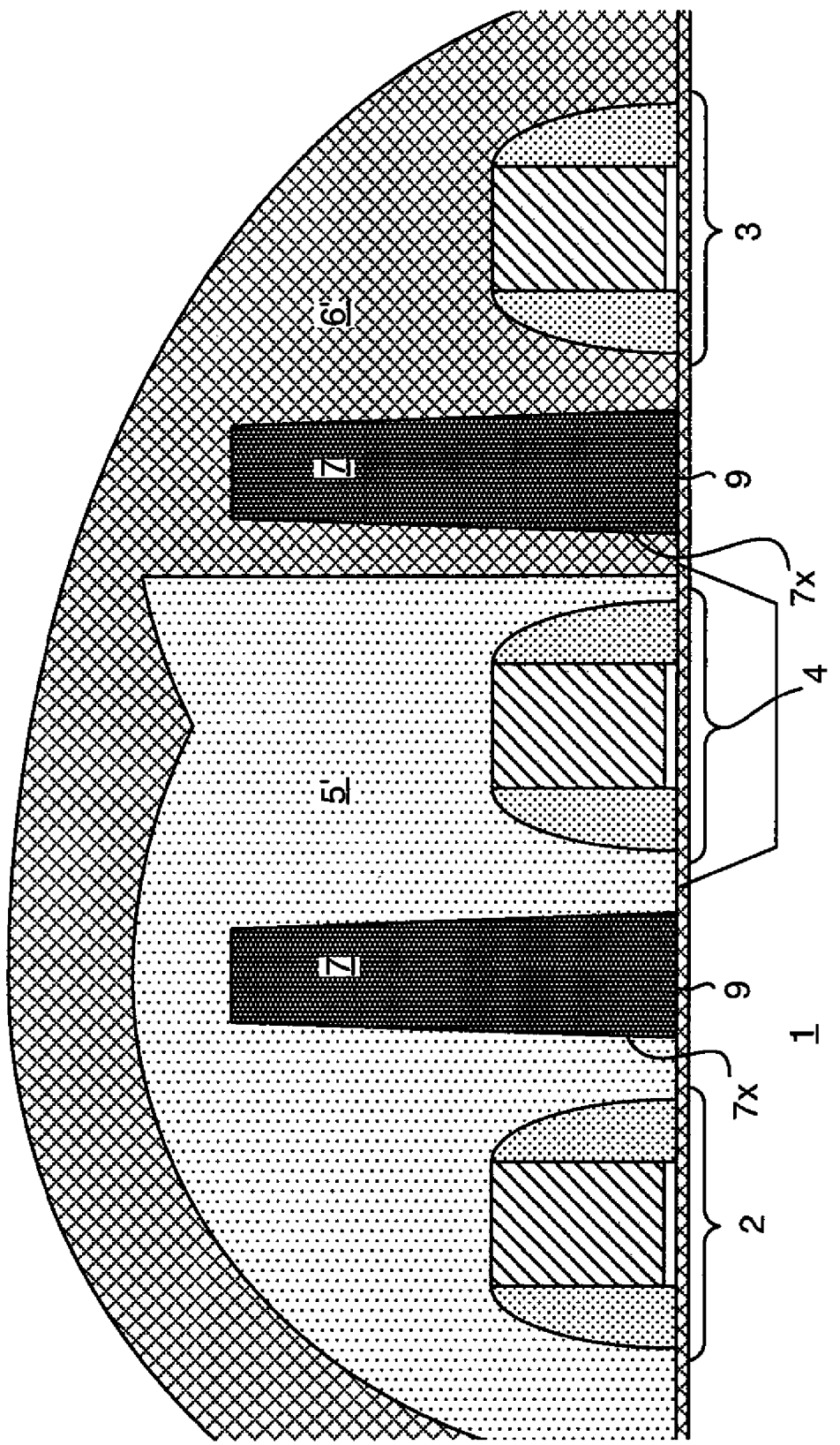
Figure 10:
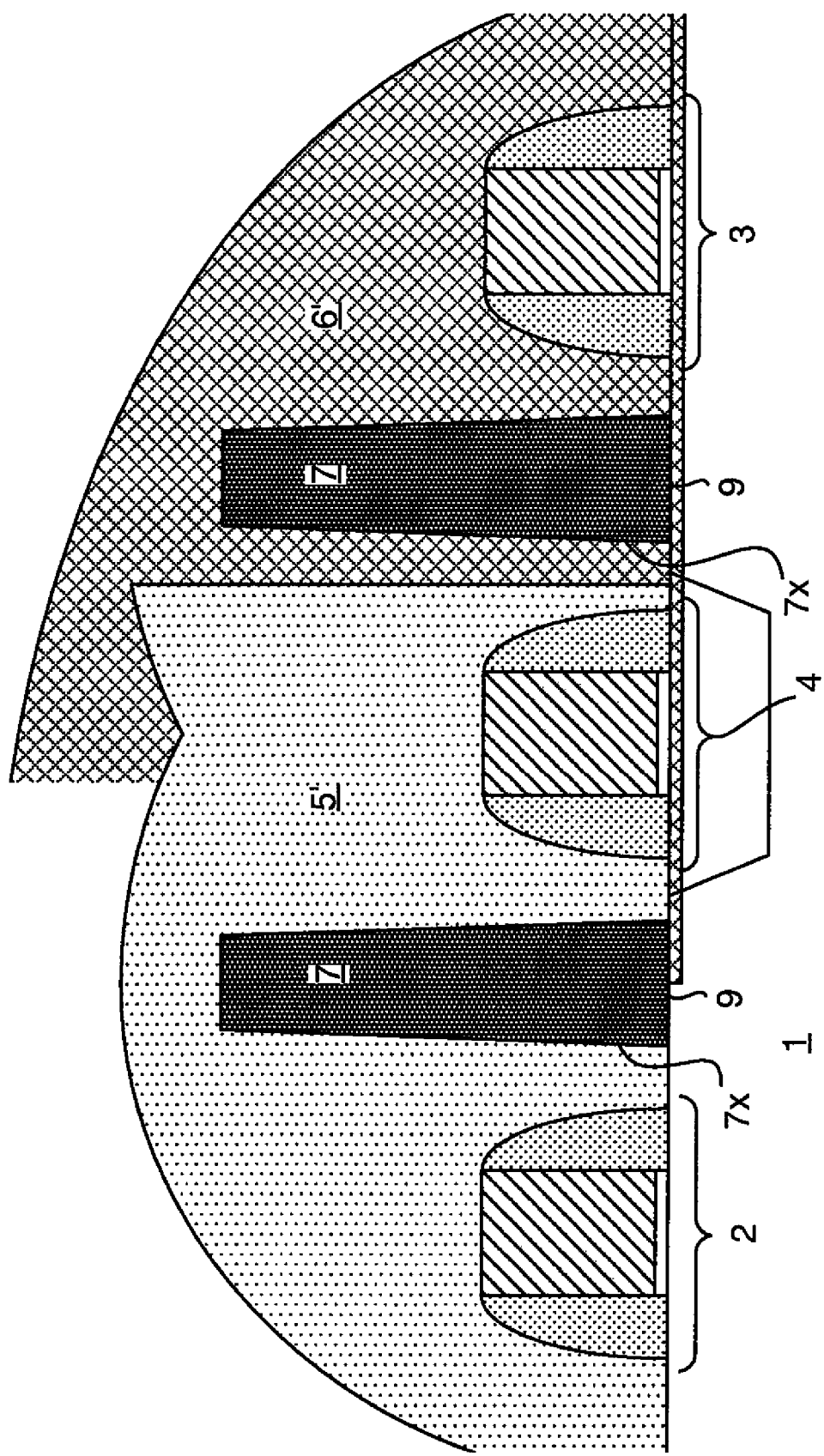

FIG. 7 depicts the forming of a first silicon nitride layer 5' on the silicon layer, and FIG. 8 depicts the removal of a portion of the first silicon nitride layer 5'. FIG. 9 depicts the forming of a second silicon nitride layer 6' on the silicon layer and the first silicon nitride layer 5', and FIG. 10 depicts the removal of a portion of the second silicon nitride layer 6'. The application and removal of the silicon nitride layers is a known technique and may be done by any suitable means.

Figure 11:
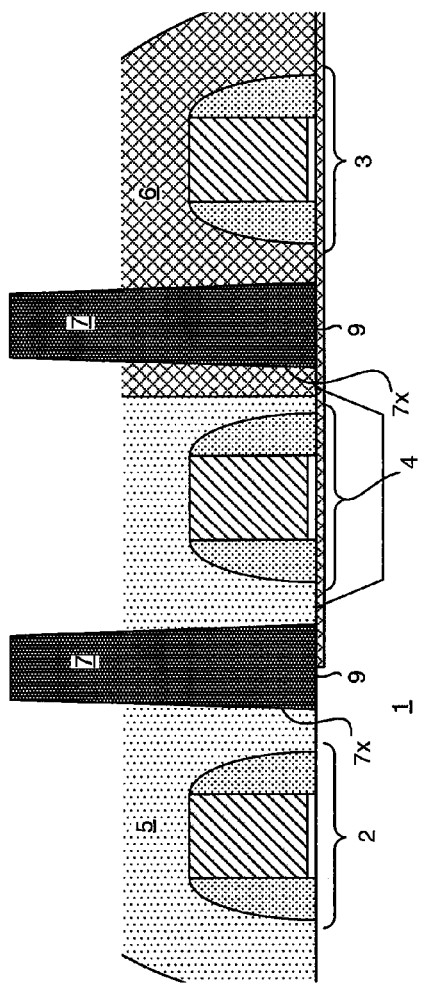
Figure 12:
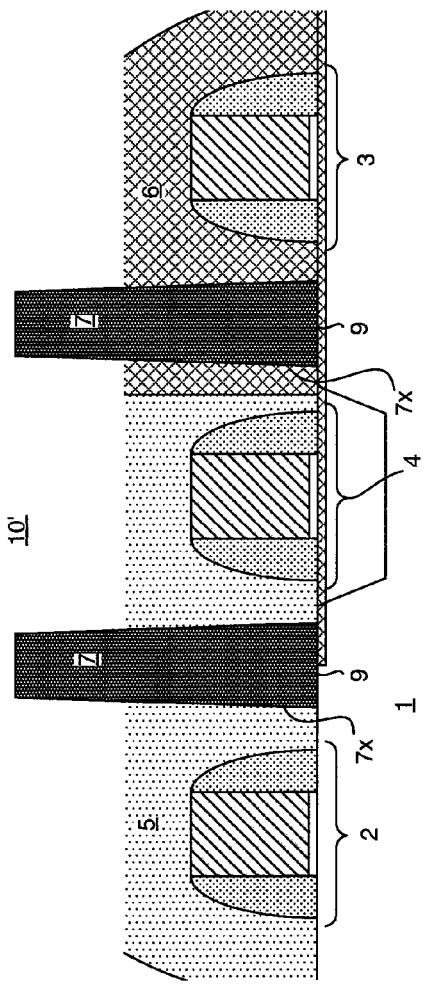
Figure 13:
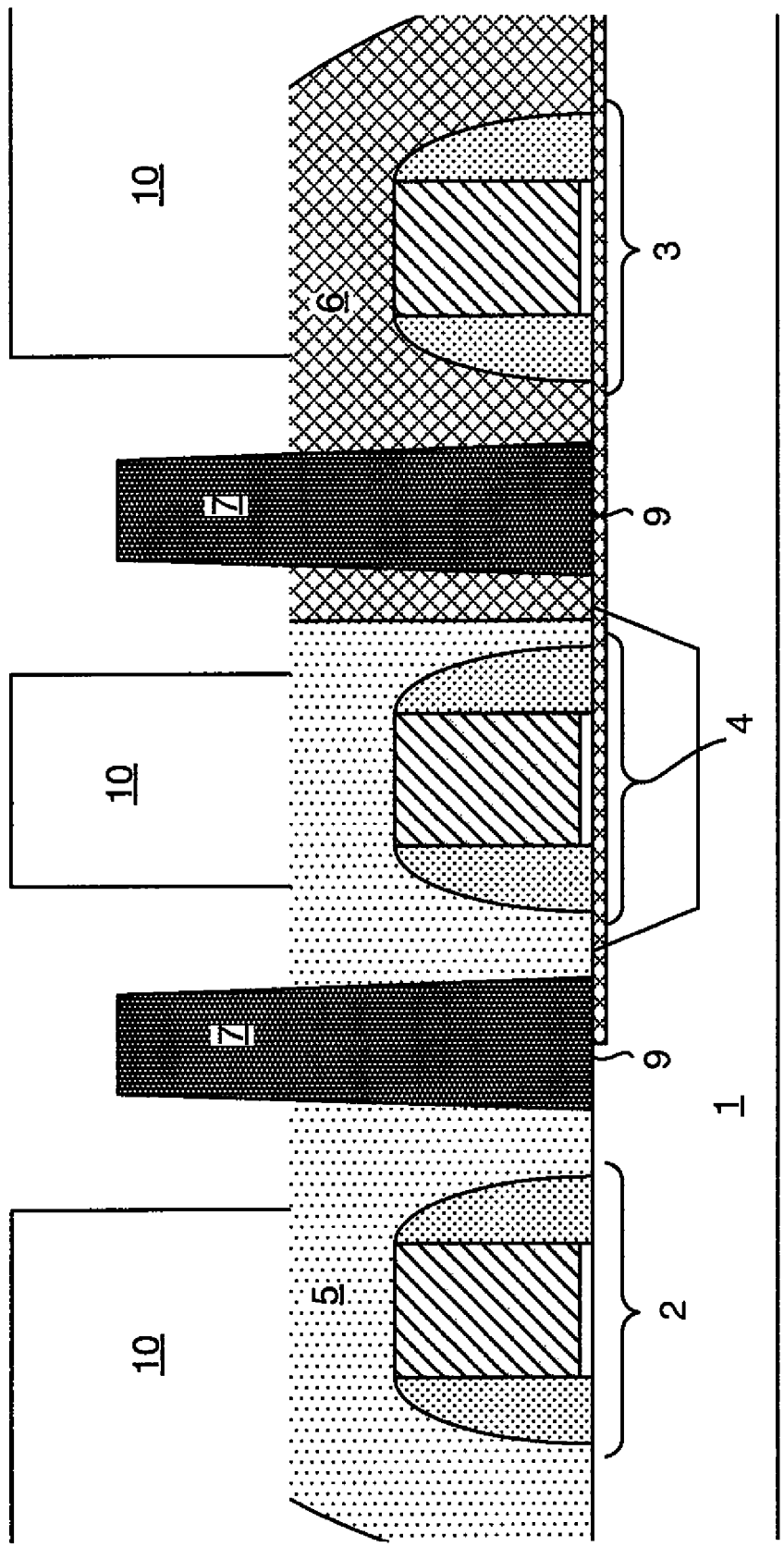
Figure 14:
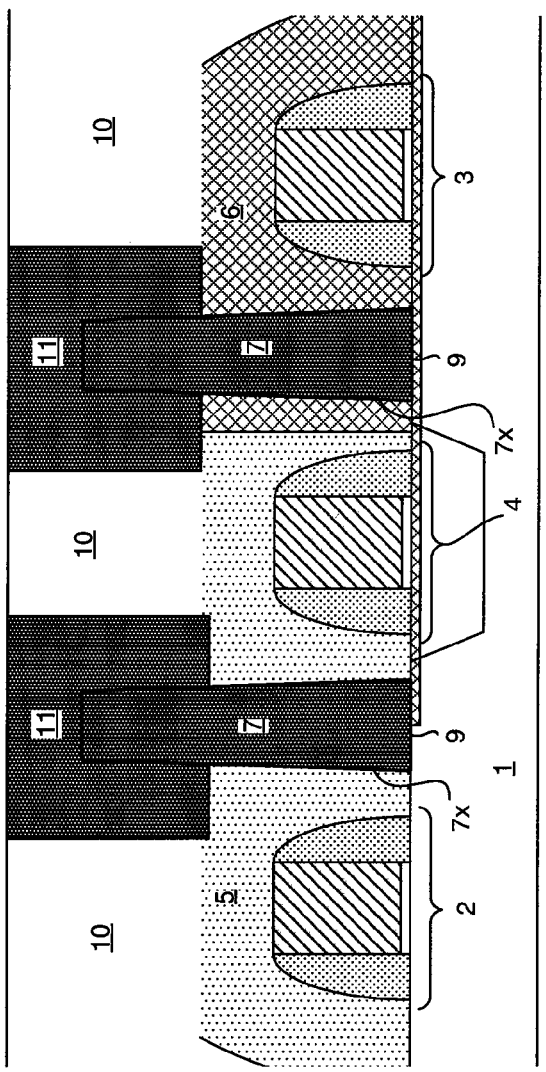

FIG. 11 depicts planing the silicon nitride layers using the plugs 7 as stoppers, such as by performing chemical-mechanical polishing (CMP). Finally, FIGS. 12-14 depict conventional back end of line (BEOL) processes. Specifically, FIGS. 12 and 13 show the addition of an insulator layer 10' such as a standard inter-layer dielectric (ILD), and subsequent etching thereof to form insulators 10. FIG. 14 shows the addition of conductive contacts 11 to each plug 7 to complete the contact structure. The contacts 11 may be the same or a different conductive material than the plugs 7.

Thus, new contact structures in semiconductor devices, and methods for making such semiconductor devices, have been described. By forming conductive plugs prior to forming the overlying and interstitial layers (such as stress liners), the conductive plugs may have a taper that is the reverse of conventional plugs. The result of such a reverse taper may be that the electrical properties of the plug are improved, and the conventional problems of plug hole over-etching and under-etching may be avoided.

What is claimed is:

1. A semiconductor device, comprising:
a silicon layer;
a first transistor having a first electrical connection region in the silicon layer, the first transistor being covered with a first stress liner;
a first conductive plug formed on and in electrical contact with the first electrical connection region and disposed within the first stress liner, the first plug having side walls that taper inward away from the silicon layer;
a second transistor having a second electrical connection region in the silicon layer, the second transistor being covered with a second stress liner, the second stress liner having a stress opposite to a stress of the first stress liner;
a second conductive plug formed on and in electrical with the second electrical connection region and disposed within the second stress liner, the second plug having side walls that taper inward away from the silicon layer; and
a dummy gate disposed on the silicon layer between the first transistor and the second transistor.

2. The semiconductor device of claim 1 wherein each of the first and second plugs has a bottom inner taper angle of less than or equal to 87 degrees relative to the silicon layer.

3. The semiconductor device of claim 1 wherein each of the first and second plugs has a bottom inner taper angle of about 80 to about 87 degrees.

4. The semiconductor device of claim 1, wherein each of the first and second plugs is made of metal.

5. The semiconductor device of claim 1, wherein the first stress liner is a first silicon nitride layer and the second stress liner is a second silicon nitride layer.

6. The semiconductor device of claim 1, further including a first conductive barrier layer disposed between the first plug and the first electrical connection region and a second conductive barrier layer disposed between the second plug and the second electrical connection region.

7. A semiconductor device comprising:
a silicon layer;
a first field-effect transistor (FET) having a fist gate formed on the silicon layer, the first FET being covered with a first stress liner;
a first metal layer disposed on the silicon layer and electrically connected to a first source or a first drain of the first FET and disposed within the first stress liner, the first metal layer having sidewalls that taper inward away from the silicon layer;
a second FET having a second gate formed on the silicon layer, the second FET being covered with a second stress liner, the second stress liner having a stress opposite to a stress the first stress liner;
a second metal layer disposed on the silicon layer and electrically connected to a second source or a second drain of the second FET and disposed within the second stress liner, the second metal layer having sidewalls that taper inward away from the silicon layer; and
a dummy gate disposed on the silicon layer between the first FET and the second FET.

8. The semiconductor device of claim 7, wherein each of the first and second metal layers has a bottom inner taper angle in a range of 80 to 87 degrees.

9. The semiconductor device of claim 7, wherein the first stress liner is a first silicon nitride layer and the second stress liner is a second silicon nitride layer.

10. The semiconductor device of claim 7, further including a first conductive barrier layer disposed between the first metal layer and the first source or the first drain to which the first metal layer is electrically connected, and a second conductive barrier layer disposed between the second metal layer and the second source or the second drain to which the second metal layer is electrically connected.

11. A method for manufacturing a semiconductor device, comprising:
providing a silicon layer;
forming a polysilicon layer on the silicon layer;
forming a metal layer on the silicon layer and on the polysilicon layer;
removing a portion of the metal layer such that at least some of the metal layer remains disposed on the silicon layer;
forming a first stress layer on the metal layer and on the polysilicon layer, the first stress layer being one of a tensile stress layer and a compressive stress layer; and
forming a second stress layer on first stress layer, the second stress layer being the other of the tensile stress layer and the compressive stress layer.

12. The method of claim 11 wherein the step of removing results in a plurality of metal structures each having sidewalls that taper inward away from the silicon layer.

13. The method of claim 12, wherein the sidewalls have an inner taper angle less than or equal to 87 degrees.

14. The method of claim 11, further including planning at least one of the first and second stress layers.

15. A method for manufacturing a semiconductor device, comprising:
forming first and second transistors and a dummy gate on a silicon layer, the dummy gate being disposed between the first transistor and the second transistor;
forming a metal layer on the silicon layer, on the first and second transistors, and on the dummy gate;
removing a portion of the metal layer such that at least some of the metal layer remains disposed on the silicon layer to form a plurality of metal structures;
forming a first stress layer on a first portion of the silicon layer, on some of the plurality of metal structures, on the first transistor, and on the dummy gate, the first stress layer being one of a tensile stress layer and a compressive stress layer; and
forming a second stress layer on a second portion of the silicon layer, on a remainder of the plurality of metal structures, on the second transistor, and on the first stress layer, the second stress layer being the other of the tensile stress layer and the compressive stress layer.

* * * * *